US012805307B2

(12) United States Patent
Contreras et al.

(10) Patent No.: US 12,805,307 B2
(45) Date of Patent: Nov. 17, 2026

(54) TSV SEMICONDUCTOR DEVICE INCLUDING INDUCTIVE COMPENSATION LOOPS

(71) Applicant: Sandisk Technologies, Inc., Milpitas, CA (US)

(72) Inventors: John T. Contreras, Palo Alto, CA (US); Md. Sayed Mobin, San Jose, CA (US); Nagesh Vodrahalli, Los Altos, CA (US); Narayanan Terizhandur Varadharajan, Bothell, WA (US)

(73) Assignee: Sandisk Technologies, Inc., Milpitas, CA (US)

( * ) Notice: Subject to any disclaimer, the term of this patent is extended or adjusted under 35 U.S.C. 154(b) by 607 days.

(21) Appl. No.: 18/222,632

(22) Filed: Jul. 17, 2023

(65) Prior Publication Data

US 2024/0213151 A1 Jun. 27, 2024

Related U.S. Application Data

(60) Provisional application No. 63/435,310, filed on Dec. 26, 2022.

(51) Int. Cl.

| | |
|---|---|
| ***H10W 20/40*** | (2026.01) |
| ***H10W 20/42*** | (2026.01) |
| ***H10W 20/43*** | (2026.01) |
| ***H10W 44/20*** | (2026.01) |
| ***H10W 90/00*** | (2026.01) |

(52) U.S. Cl.

CPC ......... *H10W 20/497* (2026.01); *H10W 20/42* (2026.01); *H10W 20/43* (2026.01); *H10W 44/20* (2026.01); *H10W 90/00* (2026.01); *H10W 44/241* (2026.01); *H10W 90/792* (2026.01)

(58) Field of Classification Search

CPC ............. H01L 23/5227; H01L 23/5226; H01L 23/528; H01L 23/66; H01L 24/08; H01L 25/0652; H01L 2223/6672; H01L 25/0657; H01L 23/645; H01L 2924/1438; H01L 2924/14361; H01L 2924/1433; H01L 2924/1206; H01L 2224/08146; H10W 20/497; H10W 20/42; H10W 20/43; H10W 44/20; H10W 90/00; H10W 44/241; H10W 90/792; H10W 44/501; H10W 72/90

See application file for complete search history.

(56) References Cited

U.S. PATENT DOCUMENTS

2003/0127704 A1* 7/2003 Kobayashi ............ H01L 23/552 257/E23.114

2003/0231095 A1 12/2003 Liang et al.

(Continued)

FOREIGN PATENT DOCUMENTS

CN 113782519 A 12/2021

DE 102013206900 11/2013

*Primary Examiner* — Galina G Yushina

(74) *Attorney, Agent, or Firm* — Pearl Cohen LLP

(57) ABSTRACT

A semiconductor device includes semiconductor dies formed with through silicon vias (TSVs). The TSVs are coupled to contact pads in a surface of the semiconductor die by coils forming inductance loops at a number of contact pads. These inductance loops serve to distribute the capacitance at each bond pad along transmission lines, which distribution of the capacitance allows for a marked increase in read/write bandwidth for the semiconductor die.

17 Claims, 9 Drawing Sheets

(56) References Cited

U.S. PATENT DOCUMENTS

| | | | | |
|---|---|---|---|---|
| 2008/0315356 | A1 | 12/2008 | Reisner | |
| 2010/0078790 | A1* | 4/2010 | Ito | H01L 25/18 257/E23.174 |
| 2011/0291232 | A1* | 12/2011 | Yen | H01L 23/5227 336/200 |
| 2013/0063234 | A1* | 3/2013 | Kamath | H01F 27/2847 336/60 |
| 2014/0183691 | A1* | 7/2014 | Saraswat | H01L 25/0657 257/531 |
| 2014/0217546 | A1 | 8/2014 | Yen et al. | |
| 2015/0311922 | A1* | 10/2015 | Bakalski | H04B 1/006 455/552.1 |
| 2016/0035670 | A1* | 2/2016 | Chen | H01L 25/105 438/107 |
| 2016/0099301 | A1 | 4/2016 | Yen et al. | |
| 2017/0005046 | A1 | 1/2017 | Sin et al. | |
| 2020/0295727 | A1* | 9/2020 | Marek | H03H 5/02 |
| 2023/0260935 | A1* | 8/2023 | Kabir | H01L 23/5227 257/728 |
| 2023/0420439 | A1* | 12/2023 | Jang | H01L 25/0655 |

* cited by examiner

Fig. 5B
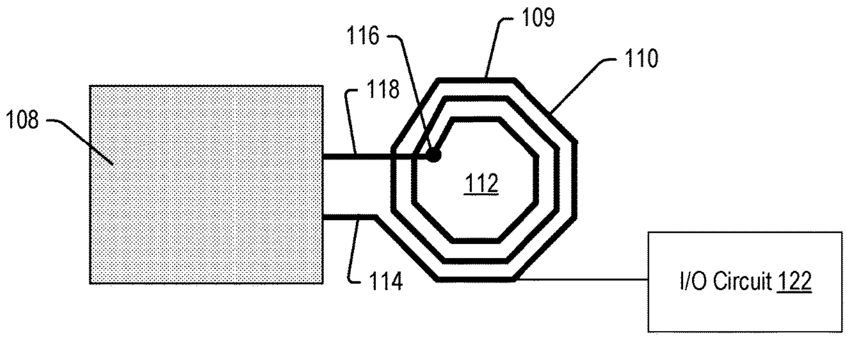
Fig. 6A
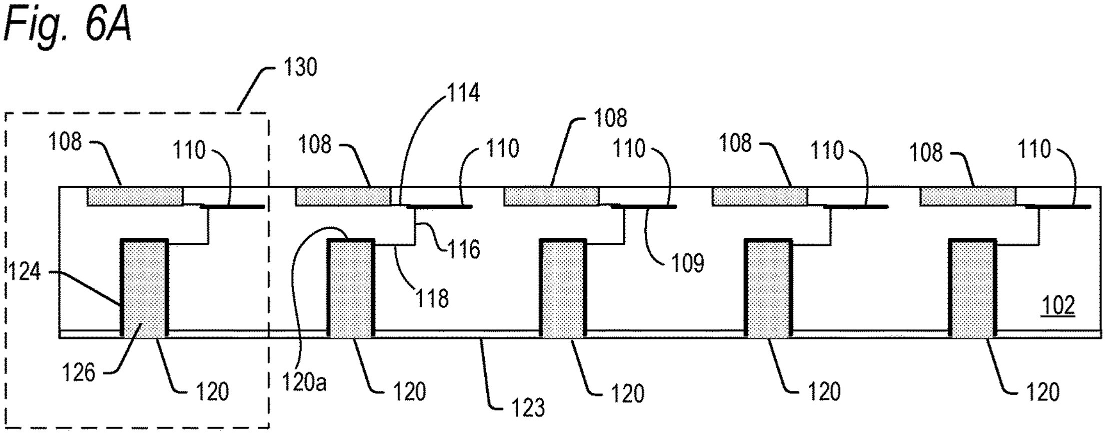
Fig. 7
Fig. 6B
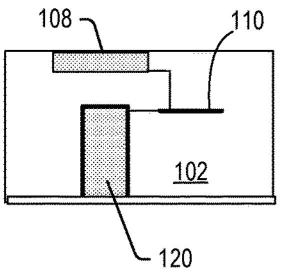
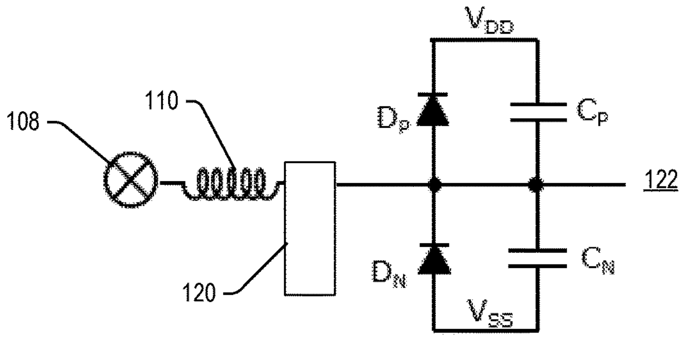

TSV SEMICONDUCTOR DEVICE INCLUDING INDUCTIVE COMPENSATION LOOPS

CLAIM OF PRIORITY

The present application claims priority from U.S. Provisional Patent Application No. 63/435,310, entitled "TSV SEMICONDUCTOR DEVICE INCLUDING INDUCTIVE COMPENSATION LOOPS," filed, Dec. 26, 2022, which is incorporated by reference herein in its entirety.

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Semiconductor memory may be provided within a semiconductor package, which protects the semiconductor memory and enables communication between the memory and a host device. Examples of semiconductor packages include system-in-a-package (SiP) or multichip modules (MCM), where a plurality of die are mounted and interconnected on a small footprint substrate. The die in such packages are often stacked in a stepped offset pattern so that the die bond pads of each die are exposed at the stepped edge of the die stack. Wire bonds may then be formed between corresponding die bond pads of the die in the die stack, and to the substrate to allow signal exchange to/from select die in the die stack.

Some memory and IC companies are moving away from wire bonding toward a technology that uses through silicon vias (TSV), in which the wire bonds are replaced by metal or conductive traces running through a wafer or die from top to bottom. This allows wafers or chips to be stacked on top of each other and electrically and mechanically bonded. TSV interconnects have a lot of advantages, such as higher pin-out count, lower impedance that allows higher data rates, die size reduction and reduced interconnect length, thus improving latency. While TSV interconnects offer improved bandwidth over traditional wire bonded semiconductor packages, the direct joining of contact pads between stacked semiconductor dies in a package results in parasitic capacitance in the package. As capacitance is inversely proportional to input/output frequency and bandwidth, there is currently a need for still higher bandwidth performance in present-day semiconductor packages.

DESCRIPTION OF THE DRAWINGS

FIGS. 5A and 5B are enlarged views of a semiconductor die and the associated inductance loops and I/O circuits according to embodiments of the present technology.

FIG. 6A is a cross-sectional view of a semiconductor die showing through silicon vias associated with each contact pad and inductance loop according to embodiments of the present technology.

FIG. 6B is a cross-sectional view a semiconductor die showing through silicon vias associated with a contact pad and inductance loop according to alternative embodiments of the present technology.

FIG. 7 is a circuit diagram showing an input/output circuit associated with the inductance loops of FIG. 5A according to embodiments of the present technology.

DETAILED DESCRIPTION

The present technology will now be described with reference to the figures, which in embodiments, relate to a semiconductor device including semiconductor dies formed with through silicon vias (TSVs). The TSVs are coupled to contact pads in a surface of the semiconductor die by coils forming inductance loops at a number of contact pads. These inductance loops serve to distribute the capacitance at each bond pad along transmission lines, which distribution of the capacitance allows for a marked increase in read/write bandwidth for the semiconductor die.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms “top” and “bottom,” “upper” and “lower” and “vertical” and “horizontal,” and forms thereof, as may be used herein are by way of example and illustrative purposes only, and are not meant to limit the description of the technology inasmuch as the referenced item can be exchanged in position and orientation. Also, as used herein, the terms “substantially” and/or “about” mean that the specified dimension or parameter may be varied within an acceptable manufacturing tolerance for a given application. In one embodiment, the acceptable manufacturing tolerance is +1.5 mm, or alternatively, +2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

Figure 1:
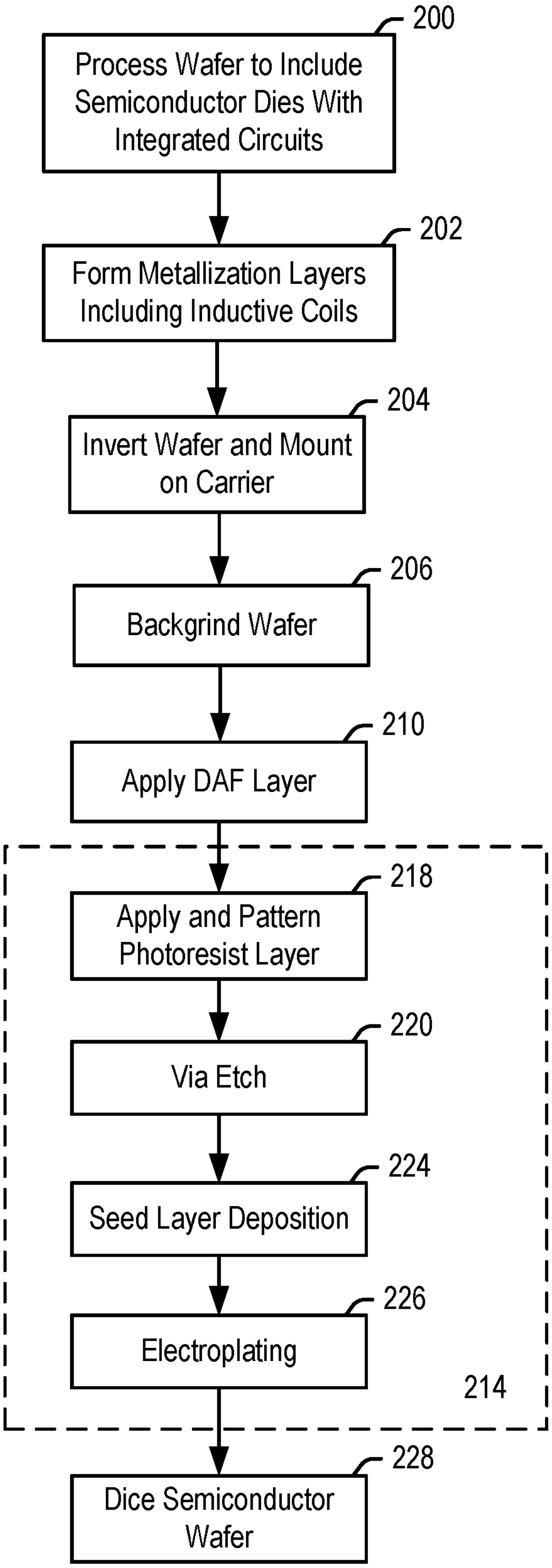
FIG. 1 is a flowchart for forming a semiconductor device according to embodiments of the present technology.
Figure 2:
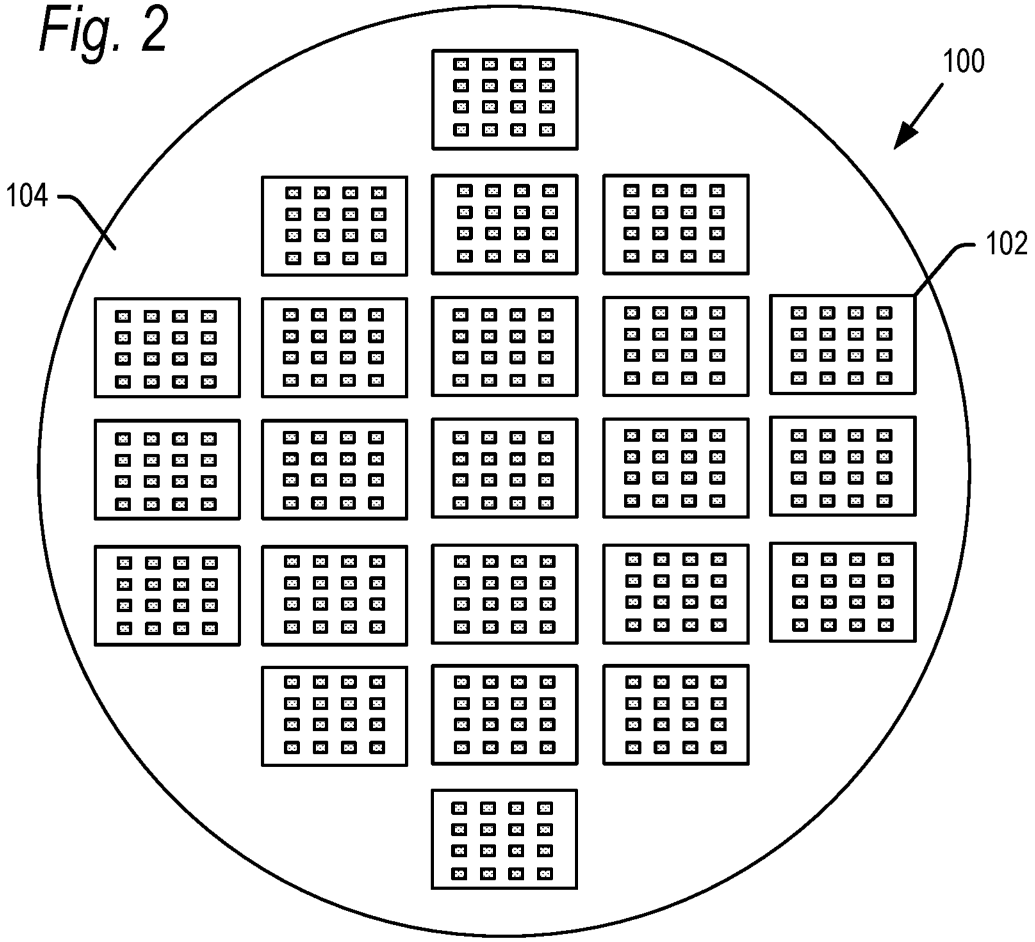
FIG. 2 is a plan view of a first major surface of a semiconductor wafer according to embodiments of the present technology.
Figure 11:
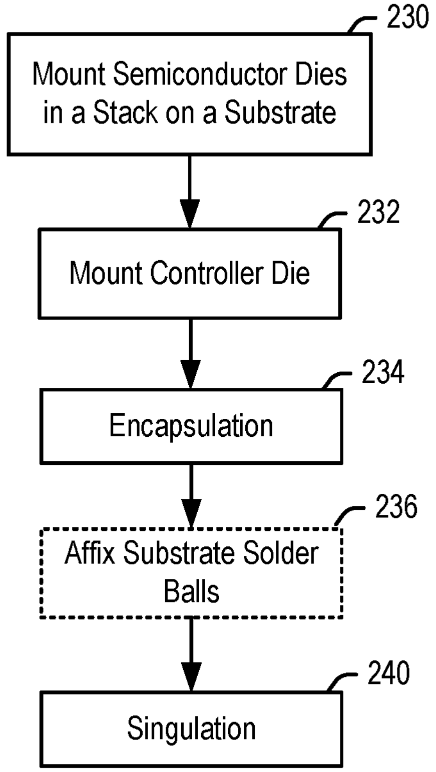
FIG. 11 is a flowchart for forming a semiconductor device using the semiconductor dies according to embodiments of the present technology.

An embodiment of the present technology will now be explained with reference to the flowchart of FIGS. 1 and 11, and the views of FIGS. 2-10 and 12-17. In step 200, a semiconductor wafer 100 may be processed into a number of semiconductor dies 102 as shown in FIG. 2. Although not critical to the present technology, the semiconductor wafer 100 may start as an ingot of wafer material which may be monocrystalline silicon grown according to either a Czochralski (CZ) or floating zone (FZ) process. The wafer 100 may be formed of other materials and by other processes in further embodiments.

The semiconductor wafer 100 may be cut from the ingot and polished on both the first major surface (active surface) 104, and second major surface (inactive surface, not shown) opposite surface 104, to provide smooth surfaces. The first major surface 104 may undergo various processing steps in step 200 to divide the wafer 100 into the respective semiconductor dies 102, and to form integrated circuits of the respective semiconductor dies 102 on and/or in the first major surface 104. The number of semiconductor dies 102 shown in FIG. 2 is for illustrative purposes, and the number of dies 102 may vary in different implementations of wafer 100.

The semiconductor dies 102 may for example be memory dies such as 2D NAND flash memory or 3D BiCS (Bit Cost Scaling), V-NAND or other 3D flash memory. However, dies 102 may be other types of dies, including for example a controller die such as an ASIC, or RAM such as an SDRAM, DDR SDRAM, LPDDR and GDDR.

The various processing steps may further include back end of line (BEOL) step 202 of forming metallization layers in and on the semiconductor dies 102. The metallization step 202 may include depositing metal contacts including contact pads 106, 108 exposed on the first major surface 104. The metallization steps may further include depositing metal interconnect layers and vias within the wafer. These metal interconnect layers and vias may be provided for transferring signals to and from the integrated circuits, and to provide structural support to the integrated circuits as is known.

Figure 3:
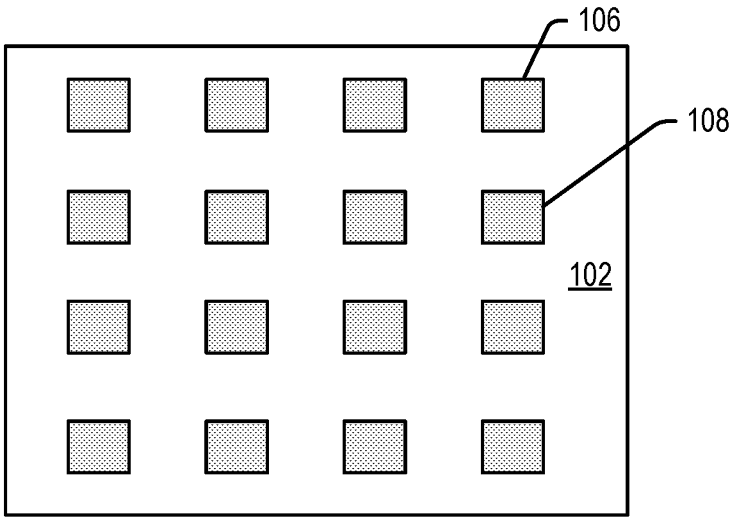
FIG. 3 is a plan view of a semiconductor die from the wafer shown in FIG. 2 according to embodiments of the present technology.

The contact pads include low frequency contact pads 106, used for example as power and ground contacts in semiconductor die 102. The contact pads may further include high-frequency contact pads 108, used for example for input/output (I/O) signal transfer to and from semiconductor die 102. FIG. 3 illustrates an example of semiconductor die 102 including a row of low frequency contact pads 106 and a number of rows of high frequency contact pads 108. However, the number and positioning of contact pads 106 and 108 is for illustrative purposes, and may vary in different implementations of semiconductor die 102. It is possible that some of signal pads 108 could be low frequency logic pads as well.

Figure 4:
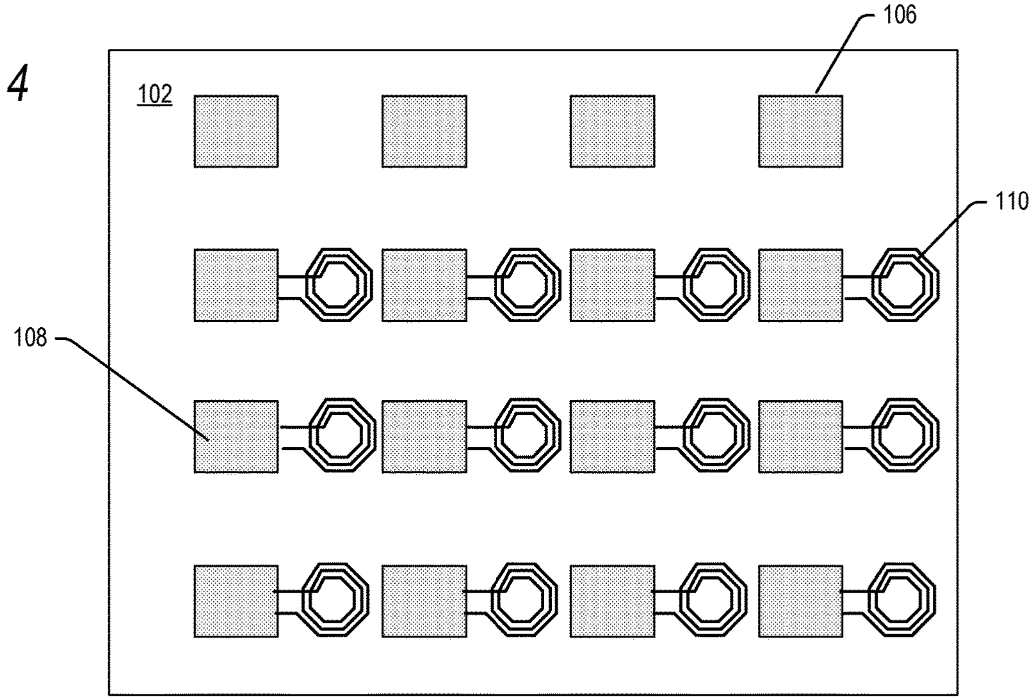
FIG. 4 is a plan view through a cross-section of a semiconductor die showing inductance loops associated with certain die bond pads according to embodiments of the present technology.

In accordance with aspects of the present technology, the metallization step 202 may further include the formation of coils adjacent contact pads 108 and beneath the major planar surface 104 as shown for example in the plan view of FIG. 4 through a cross-section of the semiconductor die 102. These coils form inductance loops 110, which serve to distribute capacitance, thereby increasing read/write bandwidth as explained below. Each contact pad 108 (whether high frequency or low frequency) may be coupled to an associated inductance loop 110. In embodiments, low frequency power contact pads 106 do not have associated inductance loops 110. However, in further embodiments, one or more contact pads 108 may not have an associated inductance loop 110, and one or more low frequency contact pads 106 may have an associated inductance loop 110.

Figure 5A:
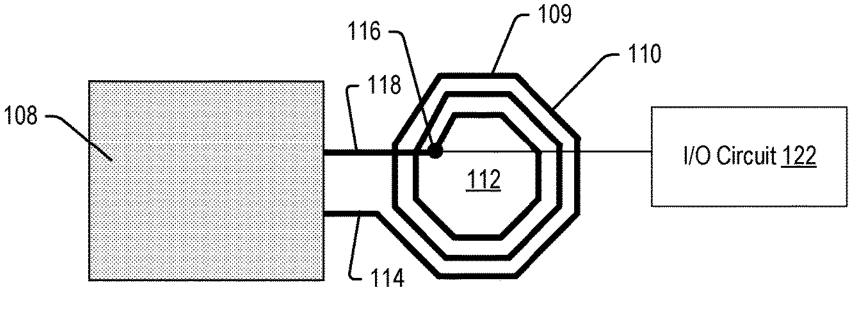

The structure and position of inductance loops 110 relative to contact pads 108 may vary in embodiments, but in one example, each inductance loop may comprise one or more planar coils formed in a single metallization layer 109 (FIGS. 5A, 5B and 6A). In embodiments, the one or more coils of an inductance loop may comprise for example between 1 and 6 coils, including for example 2 coils. Each coil may be for example 1 to 10 microns (μm) in width and depth, such as for example 3 μm, and each coil may be spaced from the next inner or outer coil by 1 to 10 μm, such as for example 3 μm. The number of coils and each of the above-dimensions and spacing of the coils may vary outside of the stated ranges in further embodiments. The inductance loops 110 may be formed for example of copper or aluminum, but may be formed of other materials in further embodiments. These other materials include but are not limited to gold, silver, tungsten, and alloys of these metals (including alloys of copper and/or aluminum).

FIGS. 5A and 5B are enlarged views of a single contact pad 108 and inductance loop 110. FIG. 6A is a cross-sectional edge view of the semiconductor die 102 including inductance loops 110. The coil(s) forming the inductance loop 110 may be spirally wound. The innermost portion of the coil of inductance loop 110 may define an open center area 112 which in embodiments may be 10 to 30 μm in width, such as for example 20 μm. The open center area may be smaller or larger than this in further embodiments. In the embodiment of FIG. 5A, the inductance loop 110 may be formed to a side of the contact pad 108. In one embodiment, the contact pads 108 may be spaced from each other by 100 μm, center to center. In such embodiments, the inductance loop 110 may be 50 μm in width, positioned between adjacent contact pads 108. The inductance loop 110 may have a first end electrically coupled to the contact pad 108 by conductive trace 114 (FIGS. 5A and 6A). The inductance loop 110 may a second end electrically coupled by a conductive via 116 (FIG. 6A and into the page of FIG. 5A) and conductive trace 118 to a TSV 120 (shown in FIG. 6A and explained below). The traces 114, 118 and via 116 may be formed in the metallization step 202 during which the inductance loops 110 are formed.

In FIG. 5A, the inductor is placed after the capacitive load of the I/O circuit 122. The inductor 110, and capacitor that is in circuit 122, are connected to TSV 120 through via 116 and conductive trace 118. Then the other side of the inductor 110 is connected to the pad 108 through conductive trace 114. FIG. 5B shows a further embodiment where the inductor is placed before the capacitive load of the I/O circuit 122. In FIG. 5B, the inductor 110, and capacitor that is in circuit 122, are connected to the pad 108 through conductive trace 114. Then the other side of the inductor 110 is connected to TSV 120 through via 116 and conductive trace 118.

In the embodiment of FIG. 6A, there is shown is 5-bit bus structure comprising 5-bit lines. One complete bit line is shown within box 130 and includes contact pad 108, inductive loop 110, TSV 120 and electrical connectors 114, 116 and 118. While FIG. 6A shows a 5-bit bus structure (with 5 bit lines), this is for illustrative purposes only, and there may be other numbers of bit lines in the bus structure in further embodiments, including for example 8-bit lines.

The coils of the inductance loop 110 may be formed at a depth of 10 to 100 μm beneath the surface 104 of semiconductor die 102. In this embodiment, the depth of the contact pads 108 may be greater than or equal to the depth of the coils of the inductance loop. Thus, the coils of the inductance loop may be coupled to the contact pad 108 with a first electrical connector consisting of horizontal conductive trace 114. The TSV 120 may have base 120*a* which extends to a depth which is lower than the depth of the coils of the inductive loop 110. Thus, the coils of the inductance loop may be coupled to the TSV 120 with a second electrical connector consisting of vertical via 116 and horizontal conductive trace 118.

However, it is understood that the depth of the coils of inductance loop 110 between the opposed surfaces of the semiconductor die 102 may vary in further embodiments. For example, the depth of the coils may be greater than a depth of the contact pad 108 but less that a depth of the base 120*a* of the TSV 120 (i.e., positioned at a depth in between the contact pad 108 and TSV base 120*a*). In such embodiments, the coils of the inductance loop may be coupled to the contact pad 108 with a first electrical connector consisting of a vertical via and a horizontal conductive trace, and the coils of the inductance loop may be coupled to the TSV 120 with a second electrical connector consisting of a vertical via and a horizontal conductive trace. In a further embodiment shown in FIG. 6B, the depth of the coils may be greater than a depth of the contact pad 108 and greater than or equal to a depth of the base 120*a* of the TSV 120 (i.e., positioned at a depth along the length of TSV 120). In such embodiments, the coils of the inductance loop may be coupled to the contact pad 108 with a first electrical connector consisting of a vertical via and a horizontal conductive trace, and the coils of the inductance loop may be coupled to the TSV 120 with a second electrical connector consisting of a horizontal conductive trace.

The inductance loops 110, traces 114, 118 and vias 116, as well as the other metal interconnect layers and vias, may be formed in successive damascene or dual-damascene processes where a dielectric substrate material is applied, patterned and filled with metal in a deposition process to form the planar horizontal metal layers and the vertical vias. The deposition process may for example include chemical vapor deposition (CVD), physical vapor deposition (PVD) or electrografting (eG). The inductance loops 110 may be formed in any of the various metallization layers of semiconductor die 102. In embodiments, the inductance loops 110 associated with all contact pads 108 may each be formed in the same metallization layer, or in multiple metallization layers. In still further embodiments, a single contact pad 108 may have multiple associated inductance loops 110, formed in different metallization layers, each coupled to each other, the contact pad 108 and the TSV 120.

The inductance loops 110 associated with the various high frequency signal contact pads 108 serve to distribute and otherwise compensate for the overall capacitance associated with read/write operations for semiconductor die 102. FIG. 7 is a circuit diagram showing the components of an I/O electrical circuit 122 formed in the integrated circuits with semiconductor die 102. The I/O circuit 122 includes power and ground voltages $V_{DD}$ and $V_{SS}$, and has capacitive elements such as the capacitance represented by $C_P$ and $C_N$ from the P-MOS and N-MOS circuit elements, respectively. The storage of current in the magnetic field of the inductance loop 110 will serve to distribute and reduce the voltages stored as capacitance, such as the capacitance $C_P$ and the capacitance $C_N$. As explained below, after completion, multiple semiconductor dies may be stacked and electrically interconnected by TSVs 120. The addition of inductance loops 110 associated with the high frequency signal contact pads 108 transforms the lumped sum of the total capacitance for each die (number of dies in stack multiplied by the capacitance of each die). With the added series inductance (L) at each die, the capacitance (C) gets distributed to create a transmission line $\sqrt{(L/C)}$, where the transmission line is terminated at the end-die at the top of the die stack. As is known, higher capacitance is a limiting factor in I/O bandwidth. Without the added series inductance (L), the capacitance would have to be considered as a lump total capacitance from all the dies connected. Thus, by distributing capacitance, the present technology allows a significant increase in bandwidth.

Figure 8:
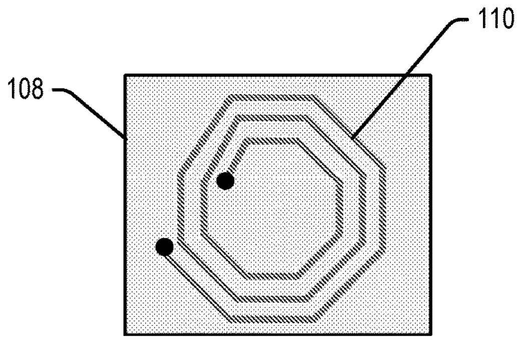
FIG. 8 is an enlarged view of a semiconductor die and associated inductance loops according to alternative embodiments of the present technology.

As noted, the inductance loops 110 may be provided in various positions and different structures in further embodiments of the present technology. FIG. 8 illustrates an embodiment where the inductance loop 110 is positioned beneath and generally centered with respect to the contact pads 108. This embodiment may be used for example where the thickness of the semiconductor die allows sufficient vertical spacing between the contact pad 108 and inductance loop 110 that added capacitance is not an issue.

Figure 9:
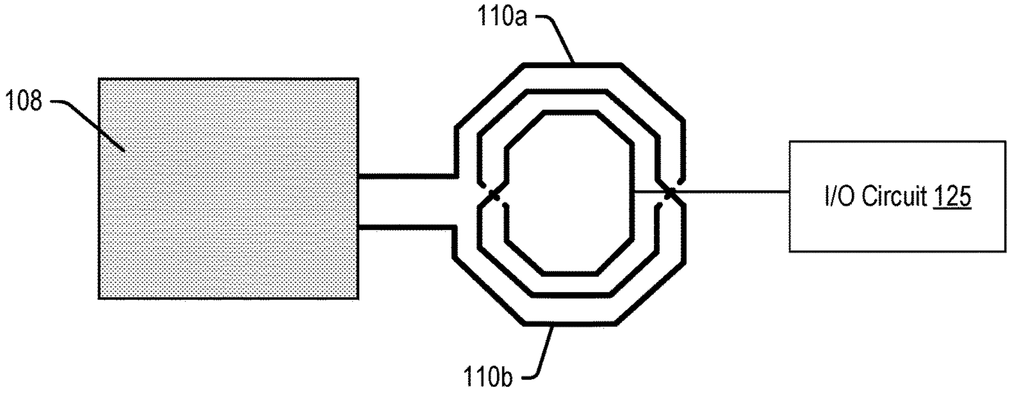
FIG. 9 is an enlarged view of a semiconductor die and associated inductance loops according to further alternative embodiments of the present technology.
Figure 10:
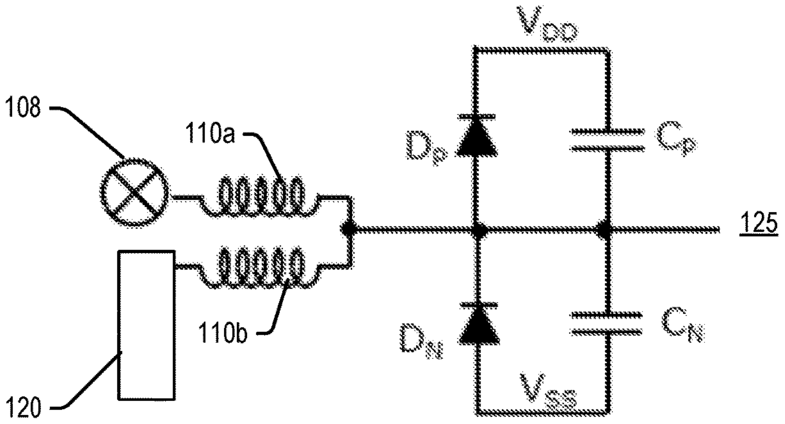
FIG. 10 is a circuit diagram showing an input/output circuit associated with the inductance loops of FIG. 8 according to embodiments of the present technology.

FIG. 9 illustrates an embodiment where the inductance loop 110 comprises a center-tap spiral having coils 110*a* and 110*b*. The dashed line segments of the inductance loop 110 shown in FIG. 9 represent portions of the coils 110*a* and 110*b* in a different horizontal plane than other portions of the coils 110*a* and 110*b*. The portions of the coils 110*a* and 110*b* in different planes may be coupled to each other using vias (into the page of FIG. 9). As shown in the I/O circuit diagram 125 in FIG. 10, this configuration of coils 110*a* and 110*b* provides a pair of inductors in series with each other. This configuration provides for a greater storage of current in the inductance loop 110 and allows for increased compensation for capacitive voltages as compared for example to the embodiment shown in FIG. 5.

Referring again to FIG. 1, after metallization step 202 in which the inductance loops 110 are formed in accordance with the present technology, the semiconductor wafer may next be flipped over and supported on a wafer carrier (not shown) in step 204. In step 206, the wafer may be thinned in a backgrind process to its final thickness of for example 25 μm to 36 μm, though the wafer may be thinner or thicker than that in further embodiments. The wafer may be thinned using for example a grinding wheel. In step 210, a layer of die attach film (DAF) 123 (FIG. 6) may be applied to the back (inactive) surface of the wafer, as by lamination. Alternatively, liquid-form adhesive material can be applied to the back surface by spin-coating, followed by baking process.

In step 214, TSVs 120 may be formed through the back surface of wafer 100 and DAF layer 123. Further details of step 214 will now be explained with reference to steps 218-226. In step 218, a layer of photoresist may be applied over the DAF layer 123 and patterned by removing areas of the photoresist over sections of the dies 102 where the TSVs 120 are to be formed. These areas correspond with the positions of contact pads 106 and/or 108.

In step 220, holes are formed at the removed areas of photoresist. The holes corresponding with contact pads 108 may be formed to a predetermined depth toward the front surface 104 of wafer 100, for example vertically spaced 5 to 50 μm from a planar layer including the inductance loops 110. Additionally, the holes are formed at positions so that conductive traces 118 (FIGS. 5 and 6) are exposed to the holes in the metallization layer(s). In one example, the holes may be etched by deep reactive-ion etching (DRIE) or other anisotropic etch process.

In steps 224 and 226, the holes may be plated and/or filled to form TSVs 120. In embodiments, a seed layer 124 (FIG. 6) may be deposited over all surfaces within the holes in step 224. The seed layer may be any of a variety of conductive materials such as copper deposited by a variety of techniques including by physical vapor deposition (PVD) or electrografting (eG). An electrical conductor 126 may be formed over the seed layer in step 226 to fill or plate the TSVs 120 and complete the formation of the TSVs 120 as shown in FIG. 6. The electrical conductor 126 may be a variety of conductive materials, including for example copper or tungsten, applied by various processes including electroplating or with solder using capillary action.

The order of steps set forth above is not limiting on the present technology and these steps may be performed in other orders in further embodiments. For example, in one embodiment, the TSVs 120 may be formed first, and then the integrated circuits and metallization layers including contact pads 106, 108 and inductive coils 110 formed thereafter.

At this point, in one embodiment, the semiconductor dies 102 may be diced from the wafer 100 in step 228 using known cutting methods such as by blade, laser, water jet, etc. The wafer 100 may be flipped over and affixed to a dicing tape. The carrier may be removed and a pick and place robot may then pick and package individual semiconductor dies 102 into a semiconductor device as will now be explained with reference to the flowchart of FIG. 11 and the views of FIGS. 12-17.

Figure 12:
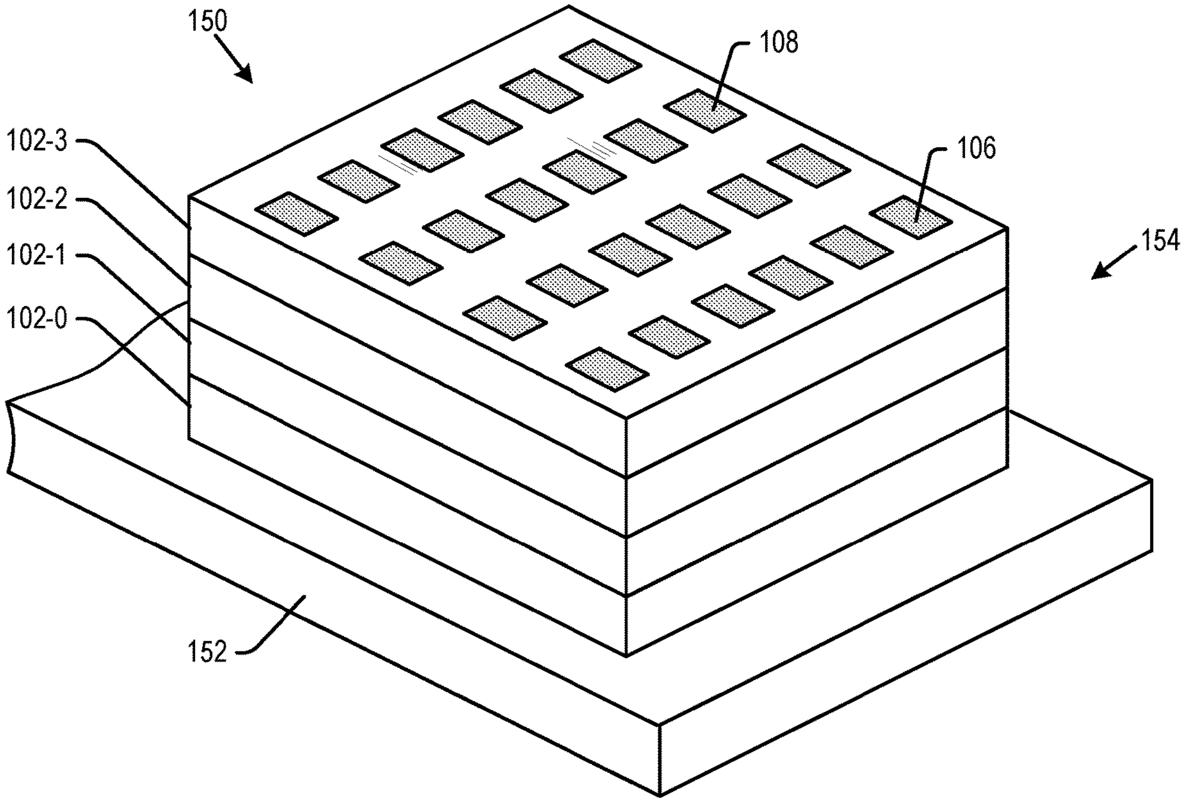
FIG. 12 is a perspective view of a semiconductor device at a first stage of fabrication with semiconductor dies stacked on a substrate according to an embodiment of the present technology.

Referring initially to the perspective view of FIG. 12, a semiconductor device 150 may be formed by mounting a number of semiconductor dies 102 on a substrate 152 in step 230 to form a die stack 154. The dies may be affixed to each other and the substrate 152 by the DAF layer 123 on the bottom surface of each die, cured to a B-stage to preliminarily affix the dies 102 in the stack 154, and subsequently cured to a final C-stage to permanently affix the dies 102 in the stack 154.

While the illustrated embodiment includes 4 semiconductor dies 102-0 to 102-3, embodiments may include different numbers of semiconductor dies in die stack 154, including for example 1, 2, 4, 8, 16, 32 or 64 dies. There may be other numbers of dies in stack 154 further embodiments. As noted above, semiconductor dies 102 are fabricated to include TSVs 120. Thus, when a die 102 is added to the stack, the TSVs 120 of that die physically and electrically couple with the contact pads 106 and/or 108 of the immediately below semiconductor die. The substrate 152 includes a pattern of contact pads 156 (FIG. 13) so that the TSVs 120 of the bottommost semiconductor die 102-0 in the stack physically and electrically couple with the contact pads 156 on the substrate 152.

Given that dies 102 were fabricated using TSVs 120, where multiple semiconductor dies 102 are included, the semiconductor dies 102 may be stacked directly atop each other with no offset or spacing to form a die stack 154. Thus, the footprint of the die stack 154 on the substrate 152 is the same size as the footprint of the individual dies 102.

In step 232, a controller die 160 such as an ASIC may be mounted on substrate 152 for controlling transfer of data between the semiconductor device 150 and a host device (not shown) such as a printed circuit board. The controller die 160 is shown wire bonded to the substrate 152 next to the die stack 154. However, the controller die may be electrically coupled to the substrate 152 by other methods including flip-chip bonding in further embodiments. Although not shown, one or more passive components may additionally be affixed to the substrate 152. The one or more passive components may include for example one or more capacitors, resistors and/or inductors, though other components are contemplated.

Figure 13:
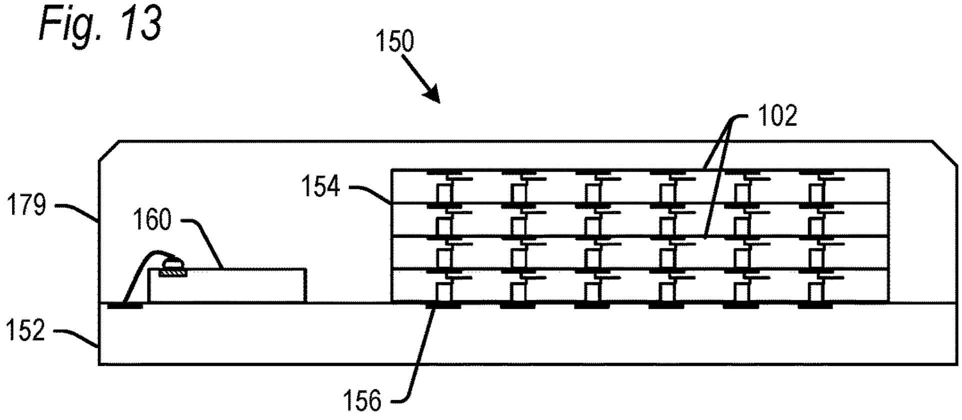
FIG. 13 is an edge view of a completed semiconductor device according to embodiments of the present technology.

In step 234, the device 150 may be encapsulated in molding compound 162 as shown in the cross-sectional edge view of FIG. 13. The molding compound 162 may be applied to encapsulate and protect the semiconductor dies 102, 160. Molding compound 162 may include for example solid epoxy resin, Phenol resin, fused silica, crystalline silica, carbon black and/or metal hydroxide. Other molding compounds are contemplated. The molding compound may be applied by various known processes, including by FFT (flow free thin) molding, compression molding, transfer molding or injection molding techniques.

In step 236, solder balls (not shown) may be applied to a bottom surface of the substrate 152 to mount the semiconductor device 150 to a host device such as a printed circuit board. Step 236 is shown in dashed lines, as it may be omitted in further embodiments.

The semiconductor devices 150 may be assembled on a panel of substrates 152 simultaneously to achieve economies of scale. In step 240, the substrates 152 may be singulated from the panel to form the finished semiconductor device 150 shown in FIG. 13.

Figure 14:
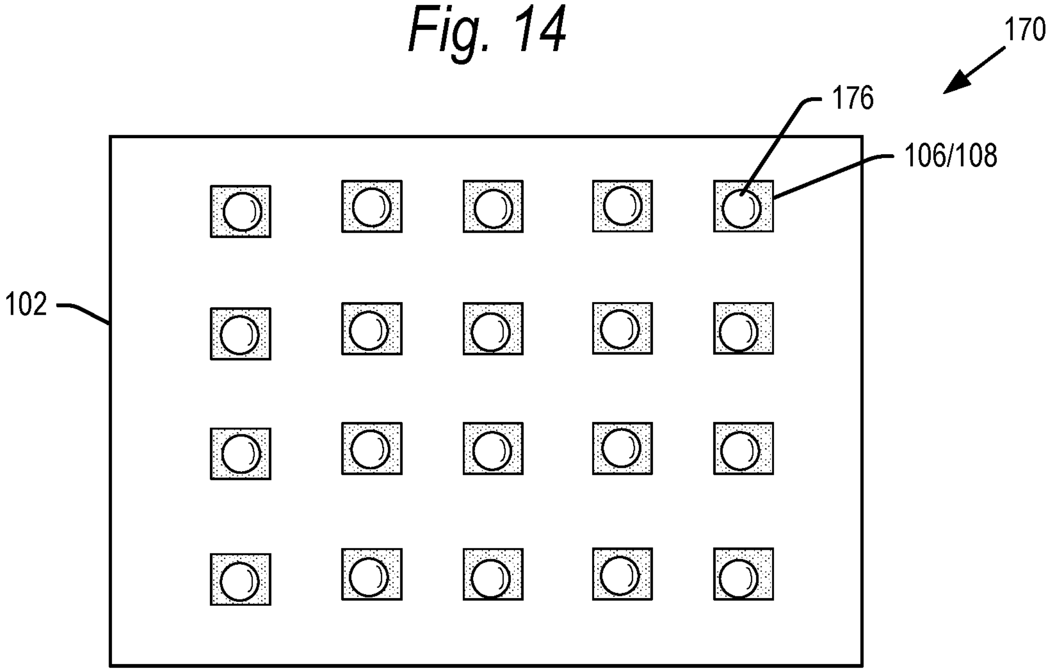
FIG. 14 is a plan view of a completed semiconductor device according to alternative embodiments of the present technology.
Figure 15:
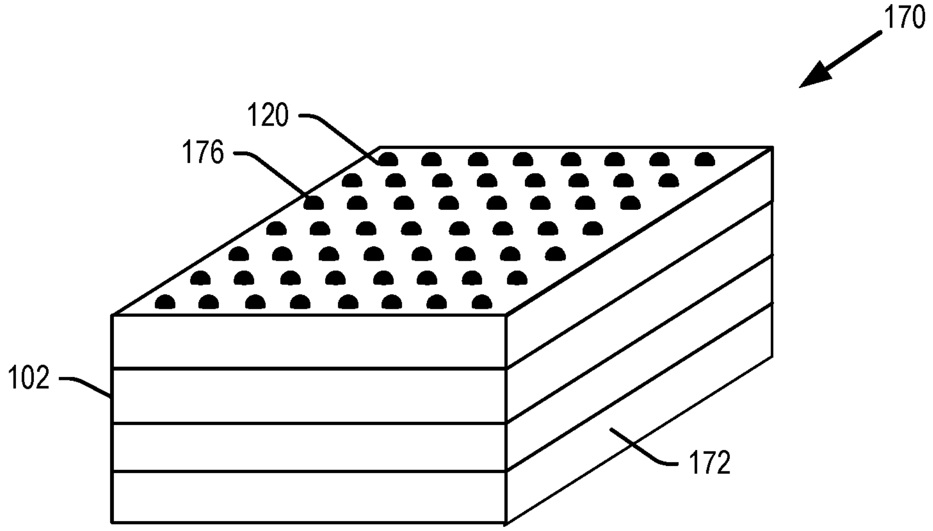
FIG. 15 is a perspective view of a completed semiconductor device according to the alternative embodiment of FIG. 14.

FIGS. 14 and 15 are plan and perspective views, respectively, of an alternative embodiment of a semiconductor device 170 which may be assembled using semiconductor dies 102 fabricated as described above. The dies 102 may be mounted into a die stack 172 such that, when a die 102 is added to the stack, the TSVs 120 of that die physically and electrically couple with the contact pads 106 and/or 108 of the immediately below semiconductor die. In this embodiment, a substrate may be omitted, and the die stack itself forms the finished semiconductor device 170. While the illustrated embodiment includes 4 semiconductor dies, embodiments may include different numbers of semiconductor dies in die stack 172, including for example 1, 2, 4, 8, 16, 32 or 64 dies. There may be other numbers of dies in stack 172 further embodiments.

In this embodiment, solder balls 176 may be placed on the top and/or bottom surfaces of the semiconductor device 170. FIG. 14 shows an example where solder balls 176 are mounted on contact pads 106 and/or 108 on a first (top) surface of the semiconductor device 170. FIG. 15 shows an example where solder balls 176 are mounted on the TSVs 120, exposed through the DAF layer 123 on a second (bottom) surface of the semiconductor device 170. The semiconductor device 170 of either embodiment may be mounted by the solder balls 176 to a host device such as a printed circuit board. Using solder balls 176 on both the top and bottom surfaces of semiconductor device 170 may allow the semiconductor device to be mounted to a printed circuit board, and then a second semiconductor device 170 to be mounted a top the first semiconductor device.

Figure 16:
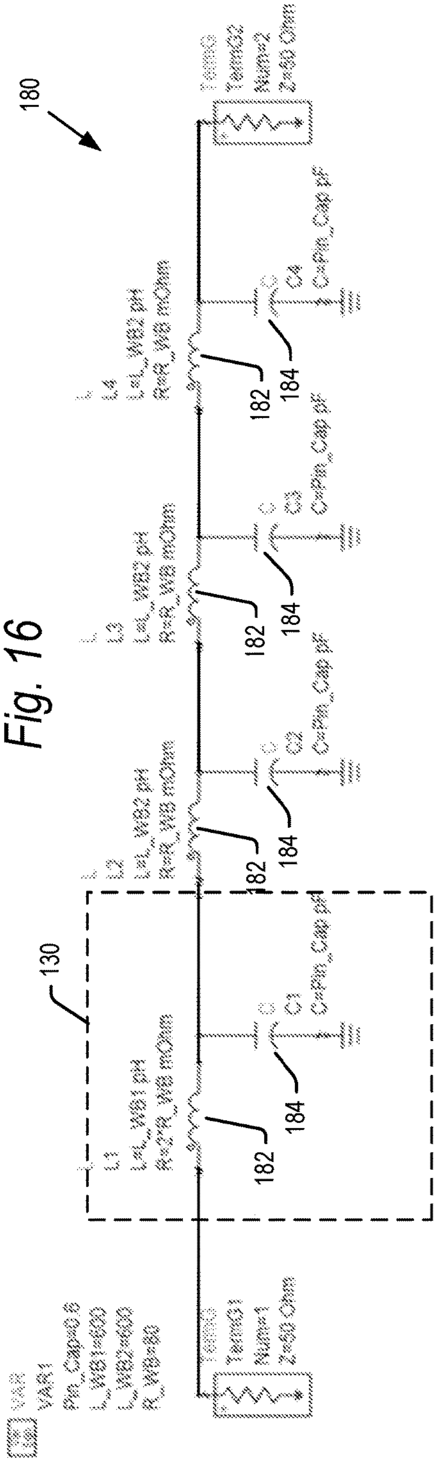
FIG. 16 is a circuit diagram of the completed semiconductor device including a number of semiconductor dies according to embodiments of the present technology.

FIG. 16 is a circuit diagram 180 of semiconductor devices 150 and 170 for the transfer of current between a top semiconductor die (TermG1) and a bottom semiconductor die (TermG2) in an embodiment comprising four semiconductor dies. The circuit diagram 180 illustrates circuit flow through a bit-line 130 (from FIG. 6) of contact pads 108 and TSVs 120 that are electrically coupled to each other within each die 102 in the die stack 154, 172. Each inductive loop 110 in this channel is shown in circuit diagram 180 as an inductor 182. The capacitors 184 represent the capacitance of the circuitry and contact pad capacitance of all dies in the stack 154, 172. In FIG. 16, the inductor 182 is placed before the capacitor 184 in each semiconductor die (as in FIG. 5B).

Figure 17:
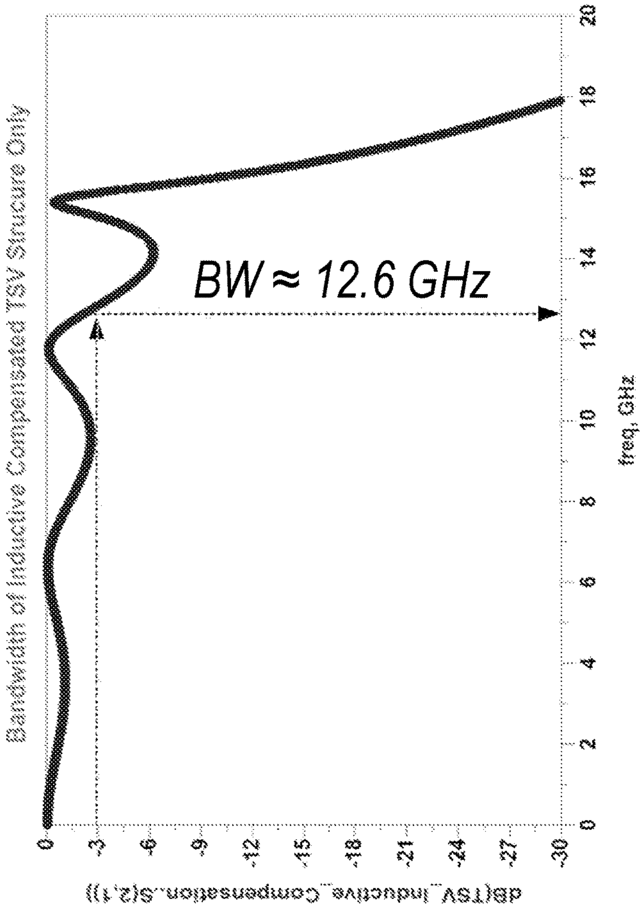
FIG. 17 is a graph illustrating input/output bandwidth of the completed semiconductor device according to embodiments of the present technology.

FIG. 17 is a graph of bandwidth through the single channel of contact pads 108 and TSVs 120 depicted in the circuit diagram 180 of FIG. 16. In one example, the signal channel may have a TSV capacitance values at each node of 0.6 pF. Each inductor 182 in the circuit diagram may have an inductance of greater than or equal to 200 pH. The inductance of inductors 182 may be higher, for example up to 600 pH, or lower than 200 pH in further embodiments. As shown in FIG. 17, using these values, the inductance compensated circuit enables a bandwidth through the channel of approximately 12.6 GHz. This represents a marked increase over conventional frequencies, for example up to five times higher than the frequencies achievable in comparable circuits without inductance compensation.

In summary, the present technology relates to a semiconductor die, comprising: a first surface, a second surface, and a depth between the first and second surfaces; a contact pad formed at the first surface of the semiconductor die; a through silicon via formed through the second surface of the semiconductor die extending through the depth toward the first surface; an inductive loop formed in the depth of the semiconductor die, the inductive loop comprising one or more coils of spirally wound electrically conductive material; a first electrical connector electrically coupling a first end of the inductive loop to the contact pad; and a second electrical connector electrically coupling a second end of the inductive loop to the through silicon via; wherein signals transmitted between the contact pad and the through silicon via pass through the inductive loop.

In a further example, the present technology relates to a semiconductor device, comprising: a plurality of semiconductor dies, each semiconductor die comprising: a contact pad formed in at a first surface of the semiconductor die, a through silicon via formed through a second surface of the semiconductor die, opposed to the first surface, the through silicon via extending through a depth of the semiconductor die toward the first surface; an inductive loop formed in the depth of the semiconductor die, the inductive loop comprising one or more coils of spirally wound electrically conductive material; a first electrical connector electrically coupling a first end of the inductive loop to the contact pad; and a second electrical connector electrically coupling a second end of the inductive loop to the through silicon via; wherein the through silicon via of a first semiconductor die of the plurality of semiconductor dies is physically and electrically coupled with the contact pad of a second semiconductor die positioned immediately below the first semiconductor die.

In another example, the present technology relates to semiconductor die, comprising: a contact pad formed at a first surface of the semiconductor die, wherein the contact pad comprises a high frequency signal pad used for input/output signal transfer; a through silicon via formed through a second surface of the semiconductor die, opposed to the first surface, the through silicon via extending through a depth of the semiconductor die toward the first surface, and means, electrically coupled to the contact pad and through silicon via, for storing current in a magnetic field to distribute capacitance within the semiconductor die; wherein signals transmitted between the contact pad and the through silicon via pass through the means for storing current.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device, comprising:

a plurality of semiconductor dies, each semiconductor die comprising:

- a contact pad formed at a first surface of the semiconductor die,
- a through silicon via formed through a second surface of the semiconductor die, opposed to the first surface, the through silicon via extending through a depth of the semiconductor die toward the first surface;
- an inductive loop formed in the depth of the semiconductor die, the inductive loop comprising one or more coils of spirally wound electrically conductive material;
- a first electrical connector electrically coupling a first end of the inductive loop to the contact pad; and
- a second electrical connector electrically coupling a second end of the inductive loop to the through silicon via;

wherein the through silicon via of a first semiconductor die of the plurality of semiconductor dies is physically and electrically coupled with the contact pad of a second semiconductor die positioned immediately below the first semiconductor die.

2. The semiconductor device of claim 1, wherein the one or more coils are planar.

3. The semiconductor device of claim 1, wherein each semiconductor die further comprises metallization layers and wherein the inductive loop is formed in the metallization layers of the semiconductor die.

4. The semiconductor device of claim 1, wherein the inductive loop is positioned to a side of the contact pad.

5. The semiconductor device of claim 1, wherein the inductive loop is positioned beneath the contact pad.

6. The semiconductor device of claim 1, wherein the inductive inductance loop comprises a center-tap spiral comprising a plurality of coils.

7. The semiconductor device of claim 1, wherein portions of the one or more coils are positioned at different depths within the semiconductor die.

8. The semiconductor device of claim 1, wherein the inductive loop is positioned at a depth that is less than or equal to a depth of the contact pad.

9. The semiconductor device of claim 1, wherein the inductive loop is positioned at a depth that is greater than or equal to a depth of a base of the through silicon via.

10. The semiconductor device of claim 1, wherein the inductive loop is positioned at a depth that is greater than a depth of the contact pad and less than a depth of a base of the through silicon via.

11. The semiconductor device of claim 1, wherein the first electrical connector comprises one or more of a conductive trace and a via.

12. The semiconductor device of claim 1, wherein the second electrical connector comprises one or more of a conductive trace and a via.

13. The semiconductor device of claim 1, wherein the contact pad of each of the semiconductor dies comprises a high frequency signal pad used for input/output signal transfer.

14. The semiconductor device of claim 13, wherein the inductive loop enables the high frequency signal pad to perform input/output signal transfer at a rate of 12.6 GHz.

15. The semiconductor device of claim 1, wherein the plurality of semiconductor dies are stacked directly on top of each other.

16. The semiconductor device of claim 1, further comprising a substrate, the plurality of stacked semiconductor dies physically and electrically mounted to the substrate.

17. The semiconductor device of claim 1, wherein the one or more coils comprise a pair of coils, the pair of coils forming a pair of inductors wired in series with each other.

* * * * *